United States Patent
Curtis et al.

(10) Patent No.: US 11,923,472 B2
(45) Date of Patent: Mar. 5, 2024

(54) DEFORMABLE ARRAY OF SEMICONDUCTOR DEVICES

(71) Applicant: CCDC Army Research Laboratory, Adelphi, MD (US)

(72) Inventors: Sabrina M. Curtis, Silver Spring, MD (US); Haotian Wang, Greenbelt, MD (US); Gabriel P. Anfinrud, Rockville, MD (US); Alexander O. Randolph, Madison, WI (US); Gabriel L. Smith, Ellicot City, MD (US); Nathan S. Lazarus, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 252 days.

(21) Appl. No.: 16/668,715

(22) Filed: Oct. 30, 2019

(65) Prior Publication Data

US 2020/0144431 A1 May 7, 2020

Related U.S. Application Data

(60) Provisional application No. 62/755,663, filed on Nov. 5, 2018.

(51) Int. Cl.
  *H01L 31/05* (2014.01)
  *H01L 31/0352* (2006.01)
  *H01L 31/18* (2006.01)

(52) U.S. Cl.
  CPC ...... *H01L 31/05* (2013.01); *H01L 31/035281* (2013.01); *H01L 31/1804* (2013.01)

(58) Field of Classification Search
  None
  See application file for complete search history.

(56) References Cited

U.S. PATENT DOCUMENTS

| | | | |
|---|---|---|---|
| 7,521,292 B2 | 4/2009 | Rogers et al. | |
| 7,932,123 B2 | 4/2011 | Rogers et al. | |
| 8,932,940 B2 | 1/2015 | Wang et al. | |
| 9,012,763 B2 | 4/2015 | Frolov et al. | |
| 9,324,733 B2* | 4/2016 | Rogers | H01L 29/72 |
| 9,450,043 B2 | 9/2016 | Nuzzo et al. | |
| 2010/0229923 A1* | 9/2010 | Frolov | H01L 31/048 |
| | | | 136/251 |
| 2015/0342050 A1* | 11/2015 | Jiang | H05K 1/028 |
| | | | 361/749 |

(Continued)

FOREIGN PATENT DOCUMENTS

WO  2022174856 A1  8/2022

OTHER PUBLICATIONS

Yu, "Ultrathin mono-crystalline silicon photovoltaic cells with mechanically flexible and stretchable design, and light-trapping structures", Master's Thesis University of Illinois at Urbana-Champaign, All Pages 2012. (Year: 2012).*

(Continued)

*Primary Examiner* — Daniel P Malley, Jr.
(74) *Attorney, Agent, or Firm* — Eric B. Compton

(57) ABSTRACT

A deformable array of semiconductor devices, and a method of manufacturing such a deformable array. The deformable array comprises a plurality of islands, where each island contains at least one semiconductor device, and the plurality of islands are arranged in an auxetic geometry.

25 Claims, 14 Drawing Sheets

(56) References Cited

U.S. PATENT DOCUMENTS

| | | | | |
|---|---|---|---|---|
| 2017/0362414 | A1* | 12/2017 | Pasini | C08L 7/02 |
| 2018/0061743 | A1* | 3/2018 | Hsu | H05K 1/0283 |
| 2018/0110266 | A1* | 4/2018 | Lee | A45F 5/02 |

OTHER PUBLICATIONS

Gray et al., "High-conductivity elastomeric electronics." Advanced Materials: 16.5 (2004) p. 393-397, Mar. 5, 2004.

Khang et al., "A stretchable form of single-crystal silicon for high-performance electronics on rubber substrates." Science 311. 5758 p. 208-212, Jan. 13, 2006.

Choi et al., "Biaxially stretchable "wavy" silicon nanomembranes." Nano Letters 7.6 (2007), p. 1655-1663, Published on Web Aug. 5, 2007.

Kim et al., "Stretchable and foldable silicon integrated circuits." Science 320.5875, Apr. 24, 2008.

Khang et al., "Mechanical buckling: mechanics, metrology, and stretchable electronics." Advanced Functional Materials 19.10 (2009), Published online: Dec. 30, 2008.

Rogers et al., "Materials and mechanics for stretchable electronics." Science 327.5973, p. 1603-1607. 2012, Mar. 26, 2010.

Lee, Jongho, et al. "Stretchable GaAs photovoltaics with designs that enable high areal coverage." Advanced Materials 23.8 (2011): p. 986-991, Published online: Jan. 11, 2011.

Lipomi, Darren J., et al. "Stretchable organic solar cells." Advanced Materials 23.15 (2011): 1771-1775, Published online: Feb. 25, 2011.

Lipomi et al., "Stretchable, elastic materials and devices for solar energy conversion." Energy & Environmental Science 4.9 (2011): 3314-3328, Aug. 3, 2011.

Kim, Dae-Hyeong, et al. "Epidermal electronics." science vol. 333.6044 p. 838-843, 2011, Aug. 12, 2011.

Yu, Ki Jun. "Ultrathin mono-crystalline silicon photovoltaic cells with mechanically flexible and stretchable designs, and light-trapping structures." Master's Thesis University of Illinois at Urbana-Champaign, 2012.

Bozolla et al., "Towards high efficiency thin-film crystalline solar cells: The roles of light trapping and non-radiative recombinations". Journal of Applied Physics, 115 (2014, doi:10.1063/1.4867008. published online Mar. 3, 2014.

Zhang, Yihui, et al. "Experimental and theoretical studies of serpentine microstructures bonded to prestrained elastomers for stretchable electronics." Advanced Functional Materials 24.14: 2028-2037, Apr. 2014.

Muslija et al., "Deep reactive ion etching of auxetic structures: present capabilities and challenges." Smart Materials and Structures 23.8, 087001, 2014.

Lazarus et al., "Stretchable Inductor Design." IEEE Transactions on Electron Devices 62.7, p. 2270-2277, May 25, 2015.

Tompkins, Randy P., et al. "Mechanical Analysis of Stretchable AlGaN/GaN High Electron Mobility Transistors." ECS Transactions 72.5, p. 89-95, 2016.

Syms et al., "Nanostructured 2D cellular materials in silicon by sidewall transfer lithography NEMS." Journal of Micromechanics and Microengineering 27.7: 075003, 2017, Jun. 2, 2017.

Ren, Xin, et al. "Auxetic metamaterials and structures: A review." Smart Materials and Structures 27.2, 023001, Jan. 24, 2018.

Curtis et al., "Structural Anisotropy in Stretchable Silicon." Advanced Electronic Materials, 1900003, 2019.

John Tolley, "Maryland, Iowa teams face off in Collegiate Inventors Competition: BTN LiveBIG," Big Ten Network BTN, available at: https://btn.com/2017/10/02/maryland-iowa-teams-face-off-in-collegiate-inventors-competition-btn-livebig. (date posted unknown, but states "2 years ago" on Nov. 25, 2019 (the day of this IDS filing); may be on or about Oct. 2, 2017 as webpage address name implies ).

Presentation titled "Stretchable Photovoltaics" made by four of the inventors (i.e., Gabriel Anfinrud, Sabrina Michelle Curtis, Haotian Wang, Alexander Randolph) at the Collegiate Inventors Competition 2017, Nov. 5, 2017, held at the U.S. Patent and Trademark Office, Alexandria, Va. (A brief summary is provided).

Photograph of a poster display titled "Stretchable Photovoltaics" which was taken at the Collegiate Inventors Competition 2017, Nov. 5, 2017, held at the U.S. Patent and Trademark Office, Alexandria, VA. (this photograph was incorporated by reference in the prov. application).

Photograph of four of the inventors (i.e., Gabriel Anfinrud, Sabrina Michelle Curtis, Haotian Wang, Alexander Randolph) standing next to a poster titled "Stretchable Photovoltaics" which was taken at the Collegiate Inventors Competition 2017, Nov. 5, 2017, held at the U.S. Patent and Trademark Office, Alexandria, Va. (this photograph was incorporated by reference in the prov. application).

S.M. Curtis, "Stress Characterization in Stretchable Semiconductors." Master's Thesis Submitted to the Graduate School at the University of Maryland, available for download at: https://drum.lib.umd.edu/handle/1903/21020?show=full (the webpage states that it was made available/accessible on Jul. 17, 2018) (this thesis was incorporated by reference in the prov. application).

Video titled "UMD Stretchable Solar Cells." The Diamondback Facebook page. Dec. 14, 2017. Available at: https://www.facebook.com/TheDiamondback/videos/10155353850596747.

James-N Grima-Cornish, "Auxetics: Don't Pull Me, I'll Get Fatter!," IUCr Newsletter (2019) vol. 27. No. 2. (May 17, 2019). Available at: https://www.iucr.org/news/newsletter/volume27/number2/auxetics.

Mariam Mir et al. "Review of mechanics and applications of auxetic structures." Advances in Materials Science and Engineering 2014 (2014).

A. Alderson, "A triumph of lateral thought." Chemistry & Industry 17 (1999): 384-391.

Graham, "An Introduction to Hexagonal Geometry" poste on nexnet.org. Available at: https://hexnet.org/content/hexagonal-geometry (Posted Apr. 16, 2010).

Sabrina M. Curtis, et al., "Auxetic Superelastic TiNiCuCo Sputtered Thin-Films Ffor Stretchable Electronics," SMST™ 2022: Extended Abstracts from the International Conference on Shape Memory and Superelastic Technologies, May 16-20, 2022 Carlsbad, California, USA Asm International® https://doi.org/10.31399/asm.cp.smst2022p0011.

Q. Li et al. "Auxetic piezoelectric energy harvesters for increased electric power output" AIP Advances 7:15104 (2017).

Y. Jiang et al, "Auxetic mechanical metamaterials to enhance sensitivity of stretchable strain sensors" Advanced Materials 30:1706589 (2018).

Jiang, Y., "Auxetic mechanical metamaterial based stretchable electronics." Doctoral thesis, Nanyang Technological University, Singapore. (2019).

Joseph N. Grima et al, "Negative Poisson's ratios from rotating rectangles" Cmst 10:137-145(2004).

De Bellis ML, Bacigalupo A, "Auxetic behavior and acoustic properties of microstructured piezoelectric strain sensors" Smart Materials and Structures 26:85037 (2017).

Li, Sheng, et al. "The development of TiNi-based negative Poisson's ratio structure using selective laser melting" Acta Materialia 105 (2016): 75-83.

Fey T, Eichhorn F, Han G, et al, "Mechanical and electrical strain response of a piezoelectric auxetic PZT lattice structure" Smart Materials and Structures 25:15017 (2015).

Ferguson WJG, Kuang Y, Evans KE, et al. "Auxetic structure for increased power output of strain vibration energy harvester" Sensors and Actuators A: Physical 282:90-96 (2018).

Curtis, Sabrina M., "Stress Characterization of Stretchable Crystalline Semiconductors." Master's Thesis University of Maryland, College Park, 2018 (Based on the delayed release request, ProQuest Dissertation Publishing stated that the thesis would be made available in the ProQuest databases on Apr. 23, 2019).

Grima, J.N., Evans, K.E., "Auxetic behavior from rotating triangles," J Mater Sci 41, 3193-3196 (2006).

\* cited by examiner

FIG. 7G
FIG 7H
KEY
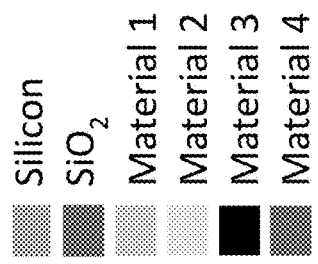

5. Spin/ spray coat/ deposit material 2 (includes side wall coverage)

6. Continue adding needed material layers for desired stretchable device

DEFORMABLE ARRAY OF SEMICONDUCTOR DEVICES

RELATED APPLICATION

This application claims benefit to U.S. Provisional Patent Application Ser. No. 62/755,663, filed Nov. 5, 2018, entitled "High Fill Factor Synclastic Bending Solar Cells," which is hereby incorporated herein in its entirety.

GOVERNMENT INTEREST

The invention described herein may be manufactured, used and licensed by or for the U.S. Government.

BACKGROUND

Field

Embodiments of the present invention generally relate to semiconductor electronics and, more particularly, to deformable arrays of semiconductor devices.

Description of the Related Art

Recent progress in the fabrication and characterization of stretchable inorganic semiconductors has paved the way to the realization of functional wearable smart electronics, demonstrating applications such as silicon (Si) PIN diode temperature sensors, electronic skin for smart surgical gloves, and stretchable GaAs photovoltaic arrays. Stretchable micro/nano electromechanical systems (MEMS and NEMS) intended for wearable electronics require repeated cycling to global strain levels that match the performance of human skin (30%-100%) without cracking, curling, buckling, or fatigue in the device.

The popular "island-bridge" approach allows brittle crystalline semiconductors to become deformable when they are connected by stretchable serpentine metal interconnects. This technique usually uses active semiconductor "islands" arrayed and connected by inactive metallic serpentine interconnect "bridges" that can accommodate large amounts of both in-plane (2D) stretching and out-of-plane (3D) flexing deformation through geometrical reconfigurations. Wavy serpentine structures are often used in stretchable electronics due to their well-studied mechanical stretching performance, dependent on material, geometry, thickness, width and elastomer substrate thickness. Therefore, state-of-the-art methods aim to pattern thin-film inorganic semiconductors directly into wavy configurations to allow the semiconductor to stretchable itself. A pre-strained substrate approach uses deep reactive ion etching (DRIE) to pattern and transfer Si and GaAs nano-ribbons from an ultrathin silicon-on-insulator wafer to an elastomer substrate held under tension. When the strain is removed from the substrate the ribbons spontaneously and periodically buckle into 3D out-of-plane waves which enabled elastic stretchability up to 100% tension and 25% compression. Selective area growth methods have successfully demonstrated in-plane Si serpentine nanowires grown from amorphous Si and c-plane growth of gallium nitride (GaN) into stretchable geometries. Alternatively, dry plasma etching techniques pattern and transfer AlGaN/GaN heterostructures into serpentine geometries forming a stretchable high electron mobility transistor. Finite element analysis models previously modeled the in-plane behavior of Si serpentine interconnects. A low amplitude (A)-to-wavelength (lamda) ratio, narrow width (w), and a large number of curves was found to reach uniaxial displacements of up to 90% of its original length while maintaining low principal strains below Si tensile strain limit (<0.2%). However, to date there have been no experimental demonstrations of freestanding in-plane stretchable Si serpentines.

Practical stretchable semiconductor arrays of devices such as cameras, LEDs, and photovoltaics, will need to be fabricated using MEMS compatible processing techniques and it will be vital the arrays maintain a large area density. The low area coverage in the stretchable semiconductor designs based on wavy structures presents a challenge for integration into these applications.

Therefore, a practical technique to fabricate a deformable array of semiconductor devices with high area density is sought.

SUMMARY

Embodiments of the invention comprise a deformable array of semiconductor devices, where the array has an auxetic geometry. Embodiments of the invention include a tunable structural design that enables inorganic and organic semiconductor devices to become highly flexible, and stretchable, and exhibit synclastic bending over non-linear surfaces, while maintaining a substantial area coverage. The design allows every component of a device to be fabricated into periodic arrangement of high fill factor units composed of device active masses connected by active interconnects which retain their electrical performance under large levels of mechanical deformation. For an embodiment where the devices are solar cells, the structure further increases active area density through the introduction of a sidewall PN junction. This design presents an interesting tunable trade-off for device fabrication of area coverage and deformability (stretchable, flexible) enabling a new generation of semiconductor devices that can conformally bend around convex, rigid, bumpy, and other non-linear surfaces.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 and its constituent FIGS. 7A-7H depict a series of steps used for fabricating an embodiment of the invention;

FIGS. 9A-9C depict devices that can be created using the fabrication process of FIG. 7;

DETAILED DESCRIPTION

Figure 1:
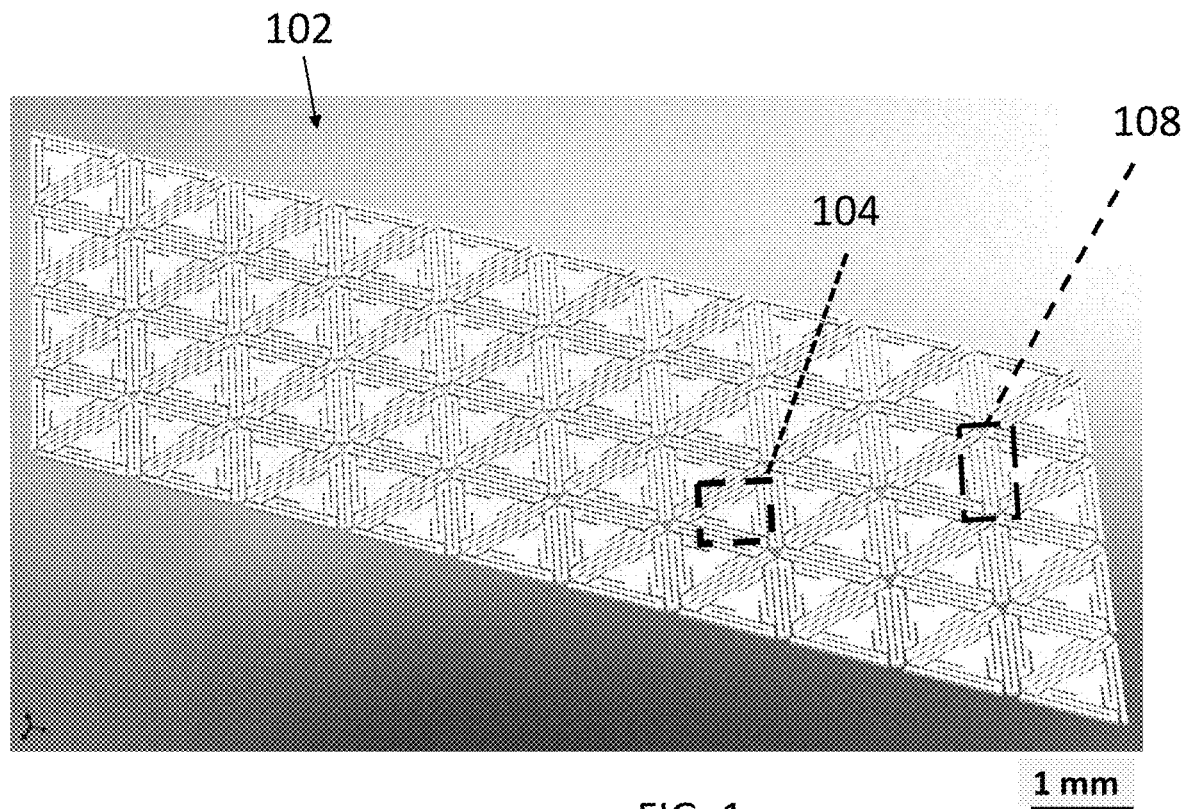
FIG. 1 shows a schematic diagram of an embodiment of the invention comprising a large area auxetic structure comprising islands interconnected by serpentine interconnect structures.

Embodiments of the invention comprise incorporation of semiconductor devices into high-fill factor auxetic geometries which exhibit synclastic conformal bending around convex surfaces. The auxetic geometries allow the brittle semiconducting materials to stretch and flex far beyond their elastic intrinsic tensile strain limits due to a negative Poisson's ratio in the structure, which means under applied tension the structure becomes thicker in the orthogonal dimension. This is a property of the geometry itself, and any deformation like stretching will first reorient the geometry in this fashion before the material's interatomic bonds have to stretch. This allows materials that are brittle, such as semiconductors, to have a buffer zone far exceeding their natural capabilities. Furthermore, this expansion in the material leads to an increase in the cross-sectional area that could be beneficial in photovoltaic and thermoelectric devices which require a high area coverage. In one specific embodiment of the invention, by incorporating an active PN junction into the top and sidewalls of the semiconductors patterned into high fill-factor auxetic geometries, a functioning solar cell is created having electrical and optical performance virtually unaffected by elastic mechanical deformation.

Auxetic materials and structures exhibit a negative Poisson's ratio meaning when they are loaded under a tensile strain in a longitudinal axis, the transverse strain in the material will also load under tensile stress. Essentially this leads to an expansion in the material under tensile strain which increase the cross-sectional area. The sign and magnitude of Poisson's ratio is controlled by the auxetic geometry and deformation mechanism through design of the material's architecture. Many useful auxetic geometries have been proposed and studied in the literature including the reentrant honeycomb, keyed brick structures, and star pattern. See, e.g., Ren, Xin, et al. "Auxetic metamaterials and structures: A review." *Smart Materials and Structures* 27.2 (2018): 023001, and, in particular, FIG. 11, herein incorporated by reference in its entirety. Many 2D and 3D printed examples of these structures have been demonstrated. These structures are composed of a repeated internal unit cell, which provides the desired feature of expanding as the overall structure is stretched. The three cases mentioned (i.e., reentrant honeycomb, keyed brick structure, and star pattern) are notable examples of this, although, other unit cells are certainly contemplated. And, while 2D and 3D auxetic geometrical structures are envisioned, it should be appreciated that for some embodiments and applications (e.g., where large surface area is sought, such as for solar cells), 2D structures may be preferable.

As opposed to conventional materials and structures which exhibit anticlastic bending, the negative Poisson's ratio of auxetic structures allow them to synclastically bend over dome shape curvatures. When bent, the structure "double bends" over spherical curvature.

FIG. 1 shows a schematic diagram of an embodiment of the invention comprising a large area auxetic structure 102, composed of rigid masses (device areas) 104 using Si triangle islands with in-plane Si serpentine interconnects 108. The structure 102 exhibits a negative Poisson's ratio which allows the structure 102 to synclastically (conformally) bend around curved surfaces. In the depicted embodiment, the devices in each triangular island 104 and serpentine interconnect 108 is a PN junction operating as a solar cell. As shall be discussed below, the solar cell device is one example of the type of device that can be formed within the deformable array. Other devices include, but are not limited to, sensors, actuators, light emitting devices, and the like. Such device arrays can be used in solar tarps, stretchable displays, and wearable applications electronics.

One embodiment of the invention uses a silicon substrate. Those skilled in the art will realize that other semiconductor substrates may be used such as, but not limited to, germanium (Ge) gallium-arsenide (GaAs), cadmium telluride (CdTe), gallium nitride (GaN), sapphire, and the like. In these cases, the semiconductor can be active (part of the device) or inactive (substrate material). Alternatively, simple polymeric materials found in typical 3D printers (i.e ABS, polyamide, thermoplastic polyurethane (TPU), polylactic acid, acrylic, polycarbonate, polypropylene, and the like) can be used as a auxetic substrate for deposition processes that take place at low temperatures (<100° C.). In these cases, the polymer substrates would most likely be inactive. Many photolithography-based fabrication processes are established to allow the release of free-standing films in a well-defined micro-structured pattern. Any of these materials could serve as the substrate, including but not limited to traditional freestanding metals (i.e., Cu, Ag, Au, Pt) and shape memory and super elastic nickel-titanium based alloys (NiTi, TiNiCu, TiNiCuCo).

The mechanical properties (flexibility, maximum elongation, fracture location) are dependent on the geometrical properties of the structural design (serpentine width, thickness, amplitude, wavelength, spacing, etc.), which gives the device a tunable design with respect to area density, and mechanical deformability. The compactness of the serpentines and islands gives one control over the area coverage of the array as well. Embodiments of the invention include a fabrication procedure using 2D contact photolithography and deep-reactive ion-etching to etch Si into this structure.

Figure 1A:
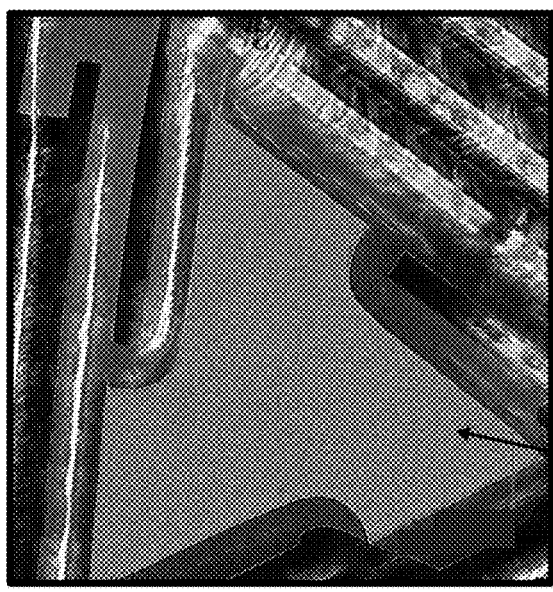
FIG. 1A and FIG. 1B show embodiments of island and serpentine constructions, respectively.
Figure 1B:
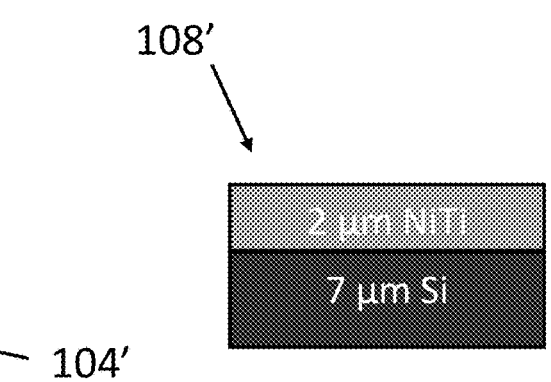

FIG. 1A shows an optical micrograph of an island 104', e.g., a 280 μm thick etched Si flexible triangular island. A similar process was used to configure Si into a serpentine structure 108' for interconnecting the islands and coating the serpentines with NiTi metal. FIG. 1B depicts a cross section of a serpentine interconnect structure 108" having 2 μm NiTi over a 7 μm thick Si layer. Major advantages of the structure presented in FIG. 1 for stretchable inorganic semiconductor electronics include its tunability in terms of available serpentine geometry, control over structural anisotropy through mask design, and ease of fabrication with deep reactive ion etching.

Figure 2:
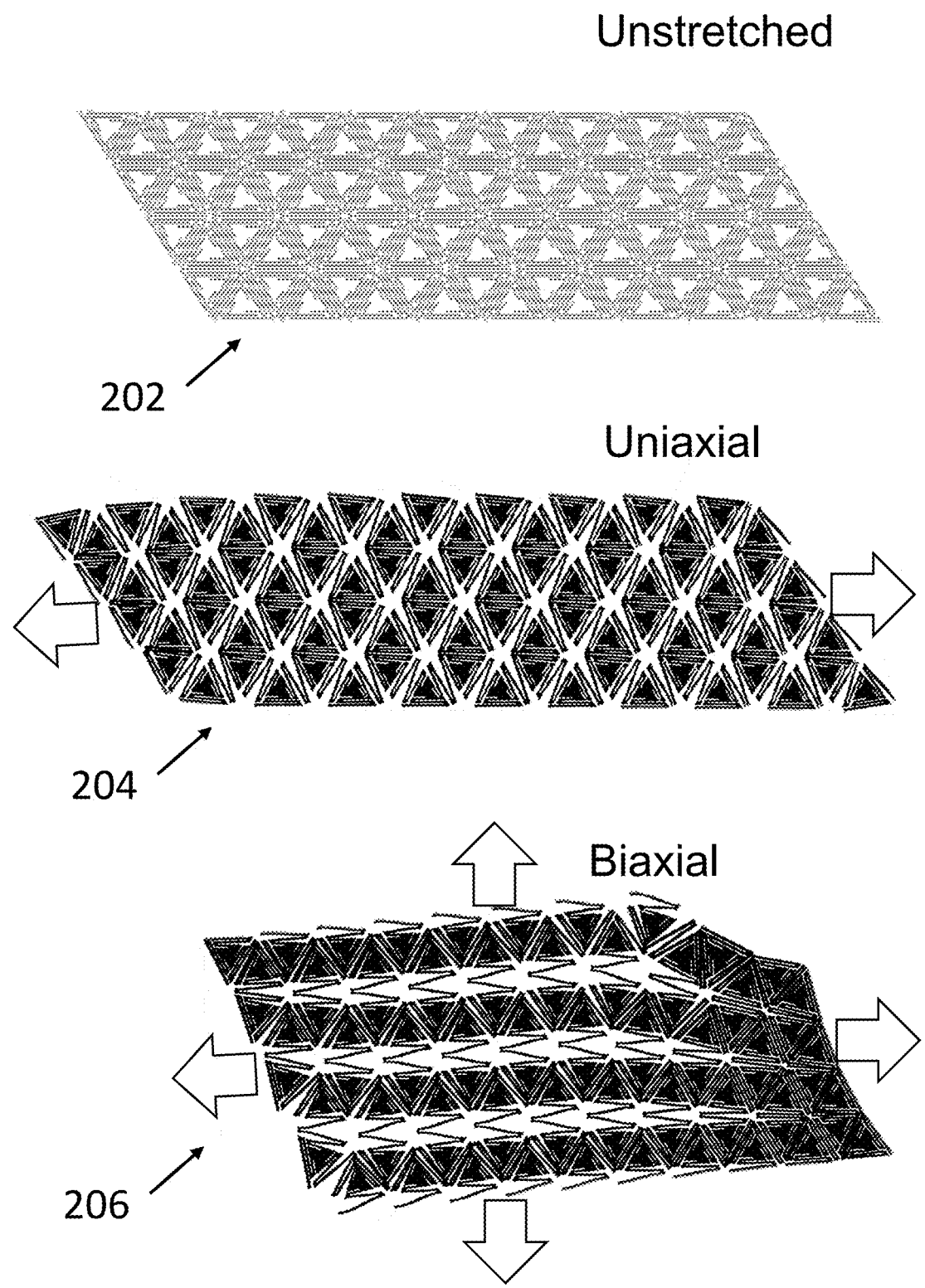
FIG. 2 demonstrates finite element analysis (FEA) on 50 μm thick (100) Si patterned into the auxetic structure shown in FIG. 1 at various strain levels.

FIG. 2 demonstrates finite element analysis (FEA) on 50 μm thick (100) Si patterned into the auxetic geometry 102 shown in FIG. 1 at equilibrium at 202. In this example, as depicted at 204, 50 μm thick Si can maintain an 80% area coverage while exhibiting uniaxial strain of 30% to match the performance of human skin. Si in this structure also exhibits independent three axis bending under a biaxial strain of 50% at 206. Since Si is the most brittle component of the semiconductor device (e.g., solar cell), these simulations verify brittle inorganic semiconductor materials can be configured into auxetic geometries which can exhibit synclastic bending, thus allows them to survive unprecedented amounts of deformation. Further, this fabrication process is advantageous over other state-of-the-art procedures because it is compatible with current 2D photovoltaic manufacturing methods.

Figure 3:
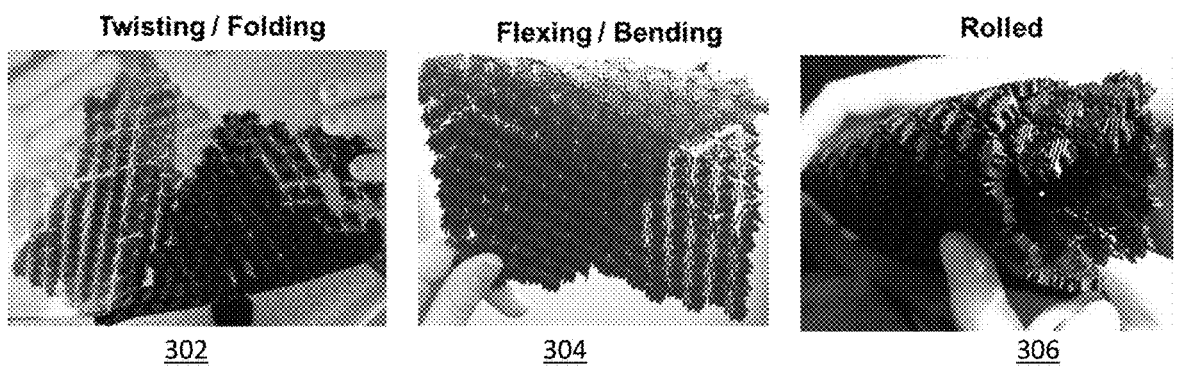
FIG. 3 shows an auxetic structure being twisted, folded, bent, and rolled.
Figure 4:
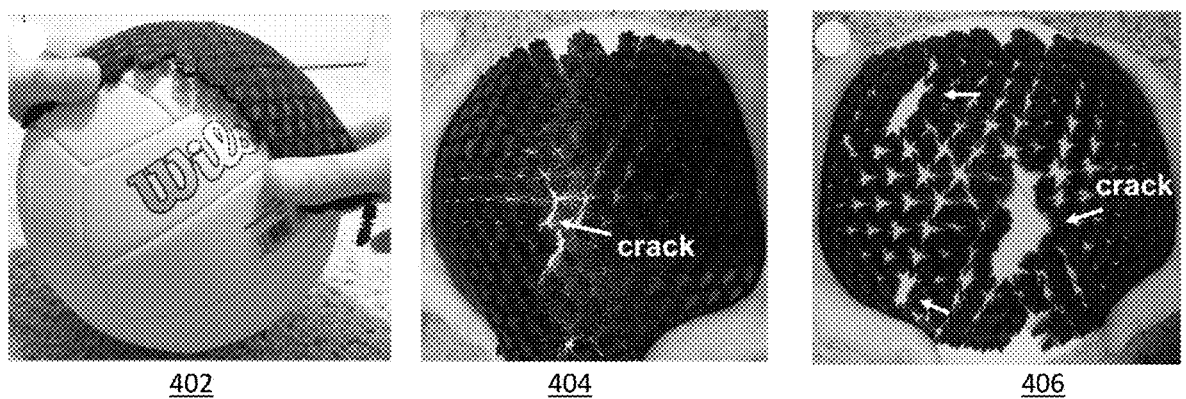
FIG. 4 shows the auxetic structure synclastically bending and conforming around the curved surfaces of a volleyball.
Figure 5:
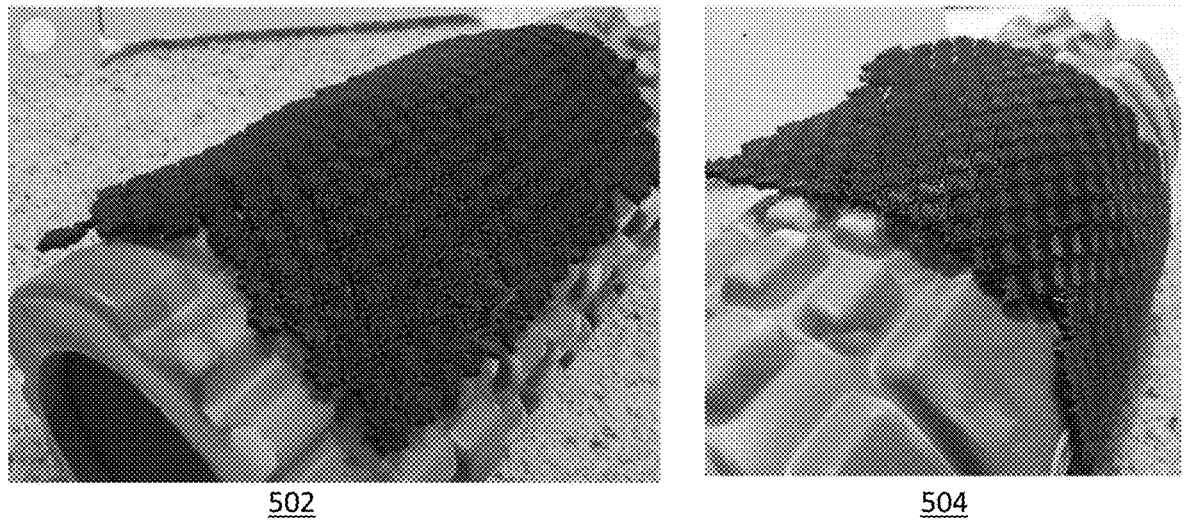
FIG. 5 shows the auxetic structure conforming around a rigid bumpy surface.
Figure 6:
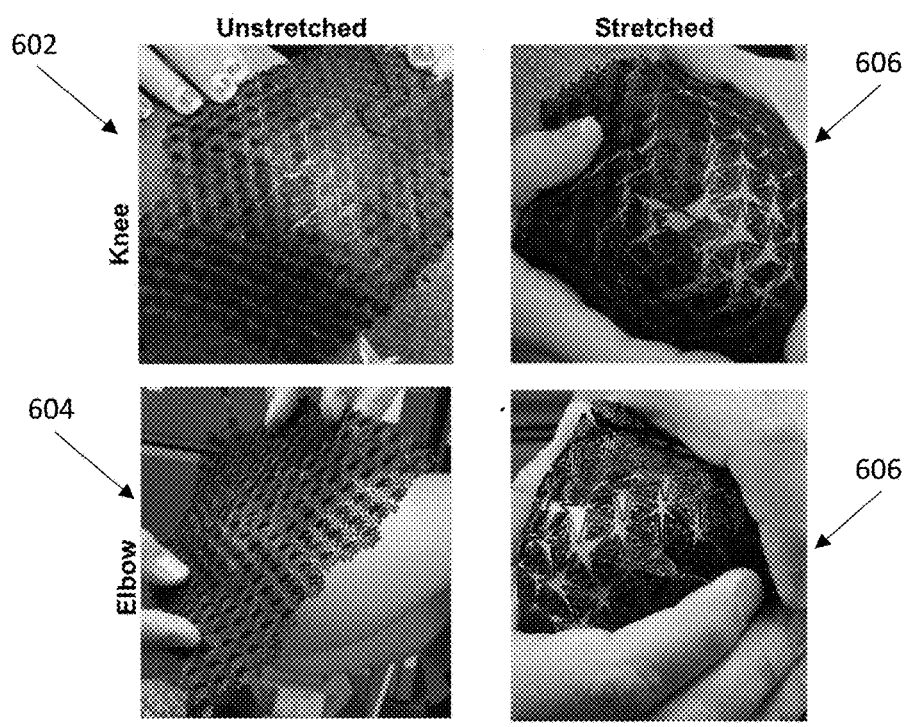
FIG. 6 shows synclastic bending can also allow the structure to conform around regions of the body with a large curvature (knee and elbow)

FIGS. 3-6 demonstrate the potential of synclastic bending. To demonstrate the deformability of an auxetic geometrical structure, a 3D printed synclastic structure was formed from 3 mm thick ABS plastic. FIG. 3 at 302, 304 and 306 respectively show the synclastic structure being twisted, folded, bent, and rolled. FIG. 4 shows, at 402, 404, and 406, the structure conforming around the curved surfaces of a volleyball. FIG. 5 shows, at 502 and 504, the structure conforming around a rigid bumpy surface. FIG. 6 shows, at 602, 604, 606 and 608 synclastic bending of the structure to conform around regions of the body with a large curvature (knee and elbow).

FIG. 7 depicts a series of steps used for fabricating an embodiment of the invention—a stretchable electronic device comprising a plurality of islands having a variety of materials to create a device that are interconnected with serpentine interconnect structures. The figures contain cross sectional views of a substrate that is processed to form the individual islands and the interconnects.

Figure 7A:
Figure 7B:

FIG. 7A depicts a cross-section of a substrate comprising a SiO$_2$ layer over a Si layer. FIG. 7B depicts the substrate of FIG. 7A having had the Si layer etched using well-known dry or wet etch techniques with SiO$_2$ serving as the hard mask. FIG. 7C depicts the structure after the Si is etched through using an anisotropic etch (e.g., ICP DRIE).

Figure 7E:

FIG. 7D depicts the structure after material 1 is spun or spray coated onto the structure. FIGS. 7E and F respectively show additional materials (materials 2, 3, and 4) being spray coated, spin coated or otherwise deposited onto the structure. The materials may form electrodes, piezoelectric films for sensors, dopants for semiconductors, and the like.

FIG. 7G depicts an optional step where an electrode is formed on the bottom of the substrate prior to FIG. 7C step of etching through the substrate. This would be required for a solar cell device using a vertical PN junction. FIG. 7H depicts another option where the oxide has been removed using, for example, an HF vapor etch followed by the deposition steps of FIGS. 7D, 7E, and 7F.

Figure 8A:
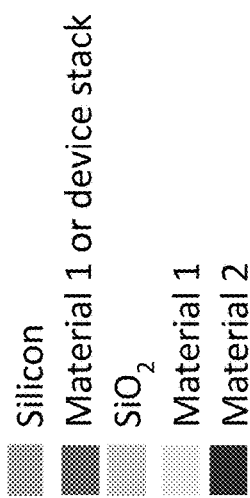
FIGS. 8A-8D depict alternative series of steps used for fabricating an embodiment of the invention.
Figure 8A:
Figure 8B:
Figure 8C:
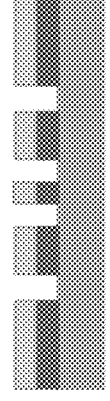
Figure 8D:
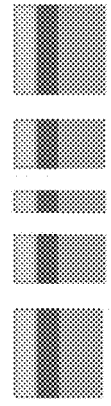
Figure 8:
FIG. 8 and its constituent
Figure 8:
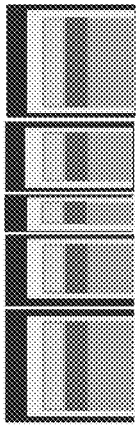

FIG. 8 depicts cross sectional views of a substrate as the steps of a process flow are used to produce a stretchable semiconductor structure on top of a silicon substrate. The process begins at FIG. 8A with a thin film material or material stack deposited on top of a silicon substrate. The material stack is then processed to form device stacks on top of the silicon substrate as shown in FIG. 8 B. These could be an array of traditional MEMS device islands. At FIG. 8C, a SiO$_2$ film is deposited over the stacks and etched to form a mask to protect the device stacks during etching of the Si substrate. FIG. 8D depicts the structure after the Si substrate has been anisotropically etched (e.g., using ICP DRIE) to form the synclastic structure. At FIGS. 8E and 8F additional materials are deposited, spun coated or spray coated onto the structure to complete the devices within the structure.

Figure 9:
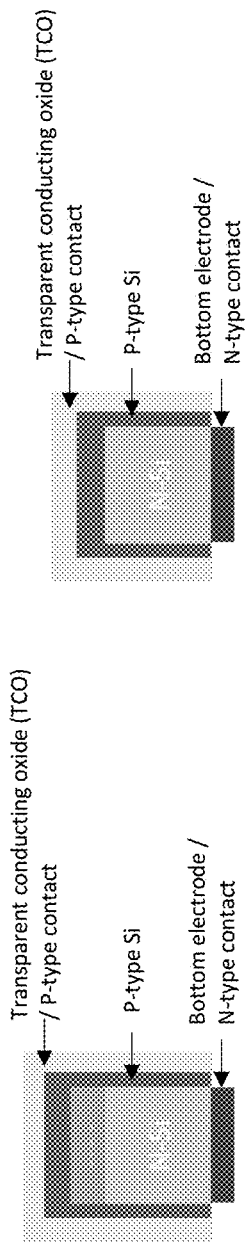
FIG. 9 and its constituent
Figure 9:
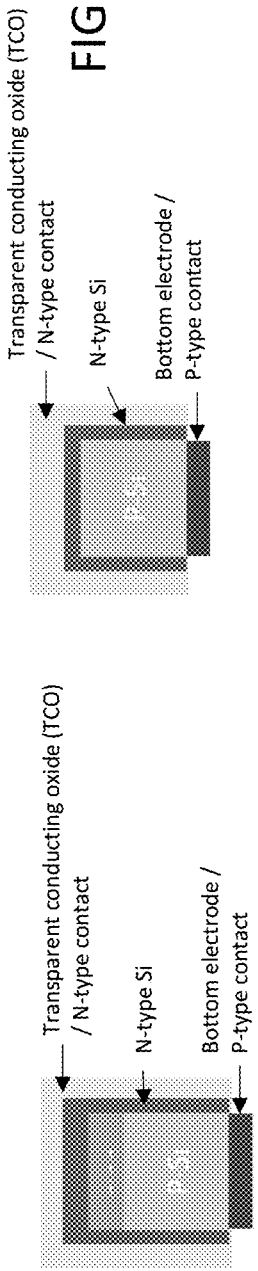
Figure 9:

FIG. 9 depicts various device cross-sections that can be fabricated using, for example, the process of FIG. 7. All these devices can be fabricated with or without an SiO$_2$ dielectric layer, depending upon the application.

FIG. 9A depicts a PN junction using an N-type Si substrate. Such a device is useful for fabrication of photovoltaic cells, thermoelectric cells, LEDs, transistors, actuators, sensors, and the like.

FIG. 9B depicts a PN junction using a P-type Si substrate. This device structure is also useful for fabrication of photovoltaic cells, thermoelectric cells, LEDs, transistors, actuators, sensors, and the like.

FIG. 9C depicts a thin film PN junction using a neutral Si substrate. This device structure is useful for fabrication of thin film photovoltaics, inorganic or organic semiconductor devices, and the like.

The foregoing are examples of the electronic device structures that can be formed into an auxetic geometry as embodiments of the invention. Those skilled in the art will understand that many other forms of electronic devices can be formed into auxetic geometric structures which can exhibit synclastic bending. The structure may include any patternable and etchable semiconductor used in, for example, hetero-structure transistor devices, photodiodes, multi-junction photovoltaic devices, and dual-junction photovoltaic devices.

Solar Cell Example

Figure 10A:
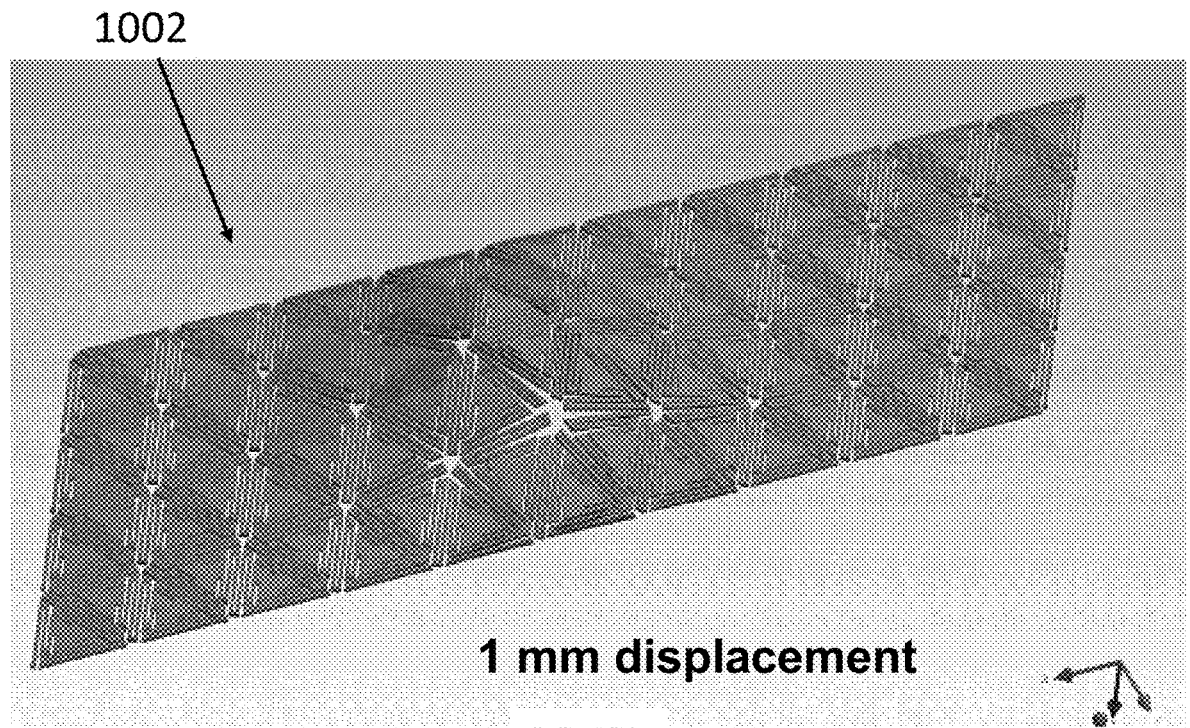
FIG. 10A demonstrates an FEA simulation of a 1 mm out-of-plane deformation of a solar cell array resulting in a maximum stress of 1.7 GPa for Si.
Figure 10B:
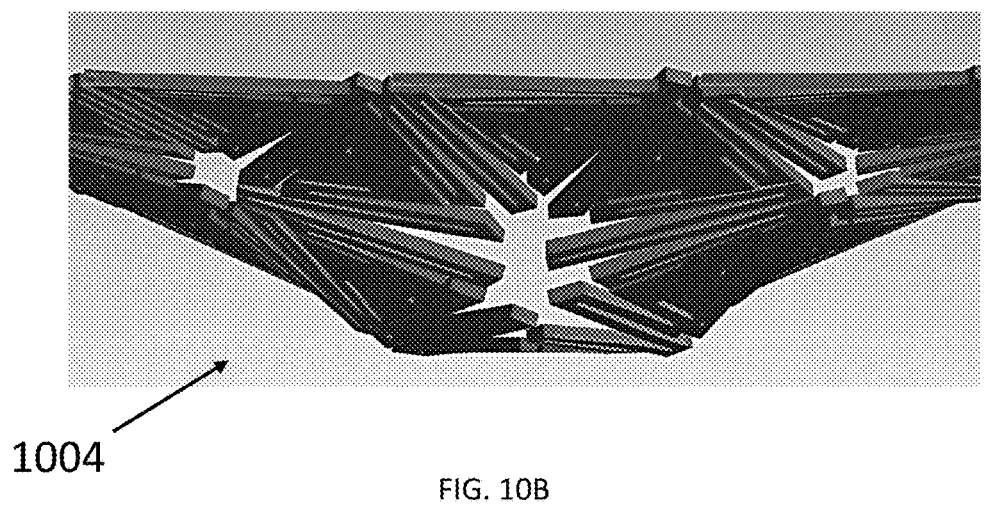
FIG. 10B shows a unit cell of the structure synclastic bending, exposing the sidewalls of the structure.
Figure 10C:
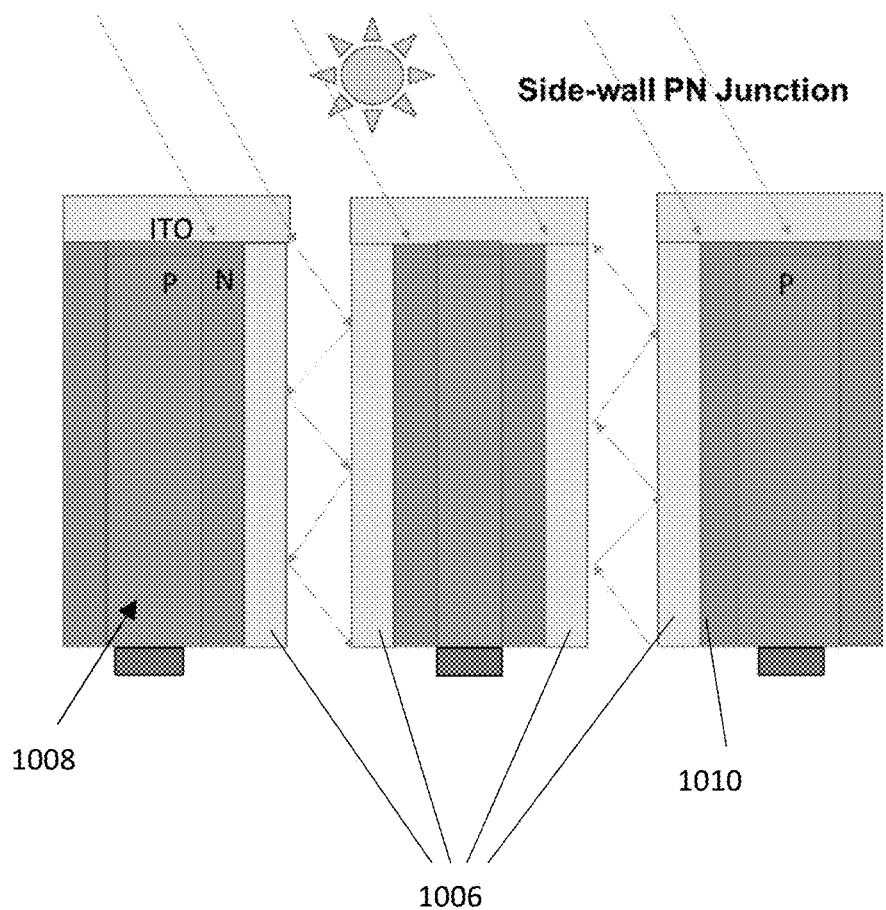
FIG. 10C depicts a unit cell with the addition of a transparent conducting oxide (ITO) on the side wall improves light capture and absorption to further increase the photo-conversion efficiency.

FIG. 10A demonstrates an FEA simulation of a 1 mm out-of-plane deformation of a solar cell array 1002 resulting in a maximum stress of 1.7 GPa for Si. The tensile stress of Si is 7 GPa; therefore, this deformation is ~4× below the breakage point. FIG. 10B shows, at 1002, a unit photovoltaic cell of the structure synclastic bending, exposing the sidewalls of the structure at 1004. This example has a top area coverage of 80% assuming a lateral or a vertical PN junction 1008. FIG. 10C shows the surface area is further increased when the sidewalls 1010 of the structure 1008 are coated with a PN junction 1008 to promote light-generated carrier collection from the sidewalls 1010. Further, the addition of a transparent conducting oxide (ITO) 1006 on the side wall improves light capture and absorption to further increase the photo-conversion efficiency. Such a solar cell structure increases the solar cell's surface area by 300% for 50 μm thick and wide serpentine interconnect structures.

Serpentine Interconnect Details

Figure 11:
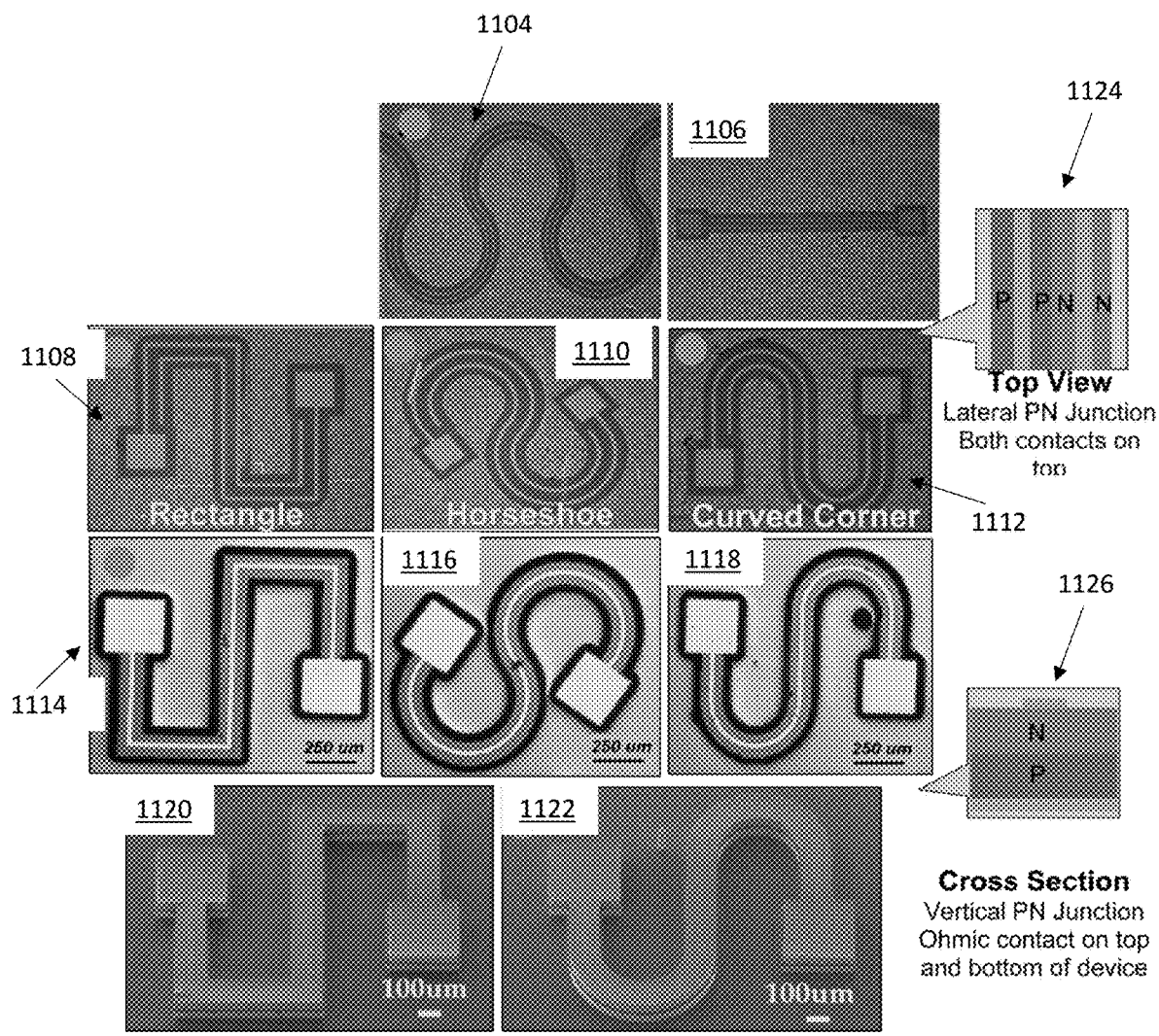
FIG. 11 depicts optical micrographs of fabricated lateral and vertical PN junction Si devices in serpentine structures and scanning electron microscopy images of fabricated vertical PN junction in-plane Si serpentine solar cells.

Embodiments of the invention include a fabrication procedure to fabricate every component of a photovoltaic device (PN junction, metal contacts, antireflection coating) into an active serpentine in-plane interconnect structure. Embodiments of the invention may use lateral PN junctions to facilitate the formation of two terminal contacts. Micrographs of fabricated lateral PN junction in-plane Si serpentine solar cells fabricated through this process are shown in FIG. 11 at 1104, 1106, 1108, 1110, and 1112, with the lateral PN junction top-down view depicted at 1124. Embodiments of the invention may also use vertical PN junctions. Optical images of Si serpentine solar cells fabricated with a vertical PN junction are shown at 1114, 1116, and 1118, with the vertical cross-section shown at 1126 depicting the PN stack. Scanning electron microscopy images of these vertical PN junction devices are shown in FIG. 11 at 1120 and 1122.

FIGS. 12A-E shows the basic fabrication procedure developed to fabricate in-plane Si serpentine mechanical test structures to experimentally verify the FEA results through tensile testing and stress characterization with micro-Raman spectroscopy. In this embodiment, (100) silicon-on-insulator (SOI) wafers were used to fabricate in-plane Si serpentines along the <110> and <100> directions through a simple 45° rotation of the geometry on the photomask design. Si curved corner serpentine structures were fabricated with the following dimensions: 5 periods, 1 mm arc length, 1 mm wavelength, 55 µm width, 250 µm arc radius, 2870 µm trace length, and a thickness of 7 µm. The top Si device layer of the SOI defines the in-plane Si serpentine thickness. Since handling a silicon layer below 100 µm is difficult, a mechanical support structure is designed consisting of a 3 mm×6 mm rectangular frame to suspend the released serpentine, with a thickness of the entire SOI wafer.

Figures 12A, 12B, 12C, 12D, 12E, 12F:
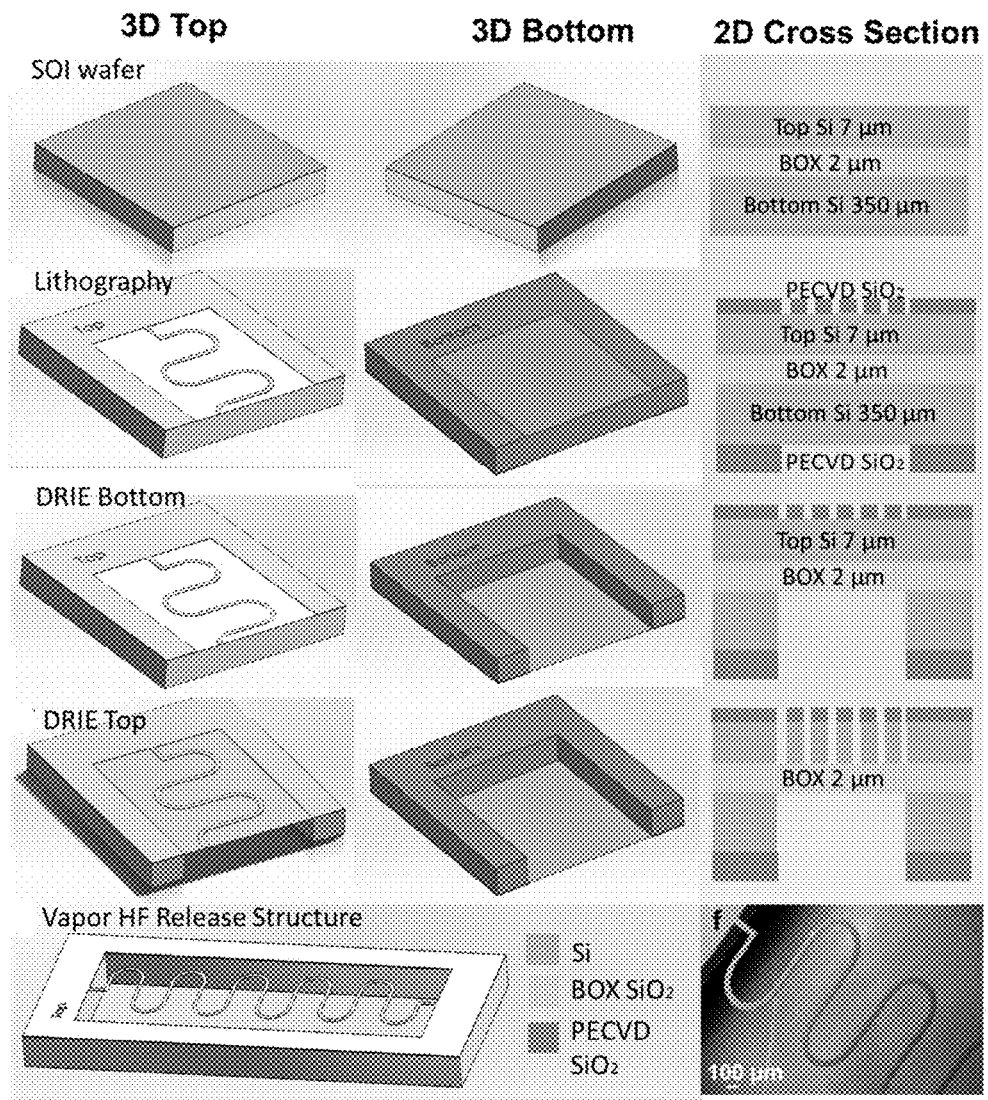
FIGS. 12A, B, C, D, E and F depict a microfabrication procedure of in-plane stretchable single crystal Si serpentine microstructures.
Figure 13A:
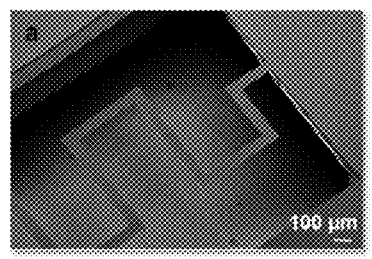
FIGS. 13A, B, and C depict SEM images of released in-plane Si serpentine structures.
Figure 13B:
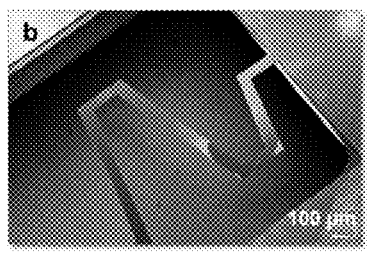
Figure 13C:
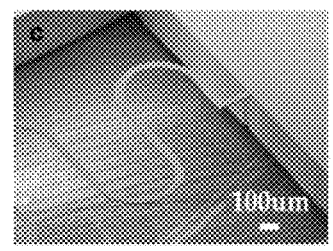

The starting material is silicon on insulator (SOI) having a cross-section of 7 µm Si, 3 µm of buried oxide (BOX) layer and 350 µm of bottom Si handle. As shown in FIG. 12B, photolithography is used to pattern the bottom Si with 2 µm thick $SiO_2$ hard mask to define the mechanical support structure. Backside alignment is used to pattern the top Si with a 0.1 µm $SiO_2$ hard mask, consisting of both the frame and suspended serpentine pattern in the respective orientation. At FIG. 15C, the structure is fixed to a carrier wafer and DRIE is performed to etch the bottom handle side of the Si substrate until the BOX layer is exposed. Then the BOX layer is ICP etched. At FIG. 15D, with the structure fixed to a carrier wafer, the top of the device is etched via DRIE to define the serpentine structure. At FIG. 12E, the structure is released and cleaned with hydrofluoric acid. FIG. 12F depicts a scanning electron microscopy image of the final released curved corner serpentine. These methods can also be used to release rectangular, trapezoid and curved corner serpentine structures, which can be metalized post-release, as shown in FIGS. 13A, B, and C, respectively.

Figures 14A, 14B, 14C:
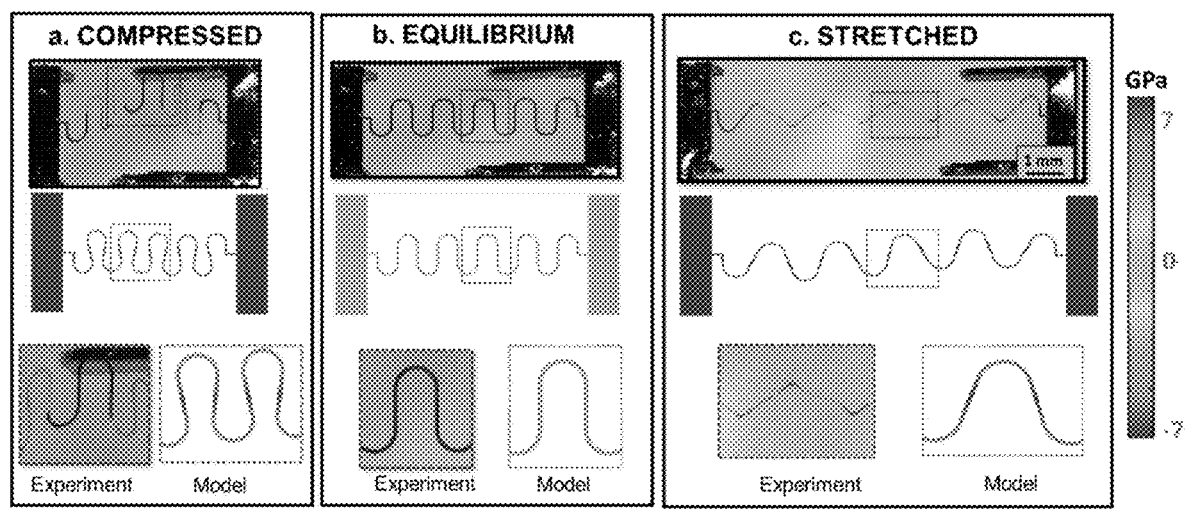
FIGS. 14A, B and C depict a comparison of uniaxial tensile test experimental and model results of Si serpentine structures.

Modeled stretching performance was experimentally verified by mounting the serpentine into a custom-built sample holder to allow uniaxial stretching tensile tests and stress characterization with micro-Raman spectroscopy. FIGS. 14A, B, and C show the global and local experiment and modeling results of a 5 mm long curved corner serpentine compressed, at equilibrium and in tension along the <110> direction. FIG. 14A shows the serpentine compressed to a global end-to-end displacement 3.8 mm, −24% its original length. FIG. 14B shows the serpentine pulled back to equilibrium at 5 mm, 0%. FIG. 14C shows the experimental and model both predicting a global strain until a fracture at 9.2 mm, 84%.

Figure 15A:
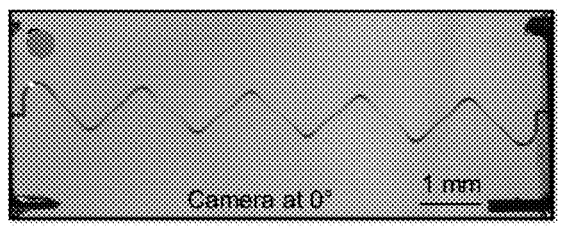
FIGS. 15A, B, C, and D depict optical micrographs of a non-uniform straining profile due to structural anisotropy in silicon.
Figure 15C:
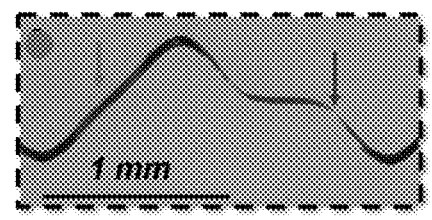
Figure 15B:
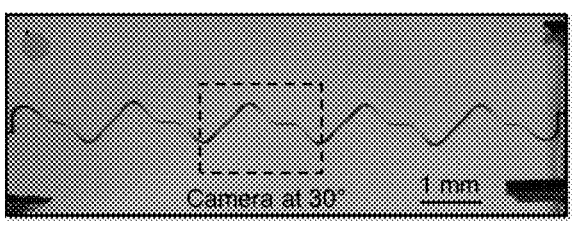
Figure 15D:
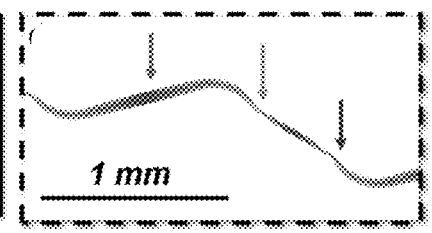

The experiment and 2D model agree on the numerical value of strain at which the serpentine fractures, however, the stress distribution profiles appear slightly different in FIGS. 14A, B, and C. Under strain, it was found that the in-plane serpentine undergoes buckling deformation on one side of the period. As Si is sufficiently thinned, it becomes highly flexible, exhibiting uniaxial bending, due to a reduction in the young modulus. The experimental straining profile is non-uniform due to the 55 µm wide curved corner Si serpentines bending out-of-plane under large amounts of deformation, thus local strain between periods is often larger than the global strain. FIGS. 15A, B, and C show the extent of the experimental non-uniform straining profile of the serpentine. One side of the period remains straight while the other side buckles twice, similar to the behavior reported for a 10 µm thick in-plane Cu curved corner serpentine. The 3D model shown in FIG. 15D confirms this buckling behavior for 7 µm thick Si serpentines. The great agreement between model and experiment demonstrates the versatility of using FEA to model anisotropic stretchable semiconductor behavior.

Figure 16:
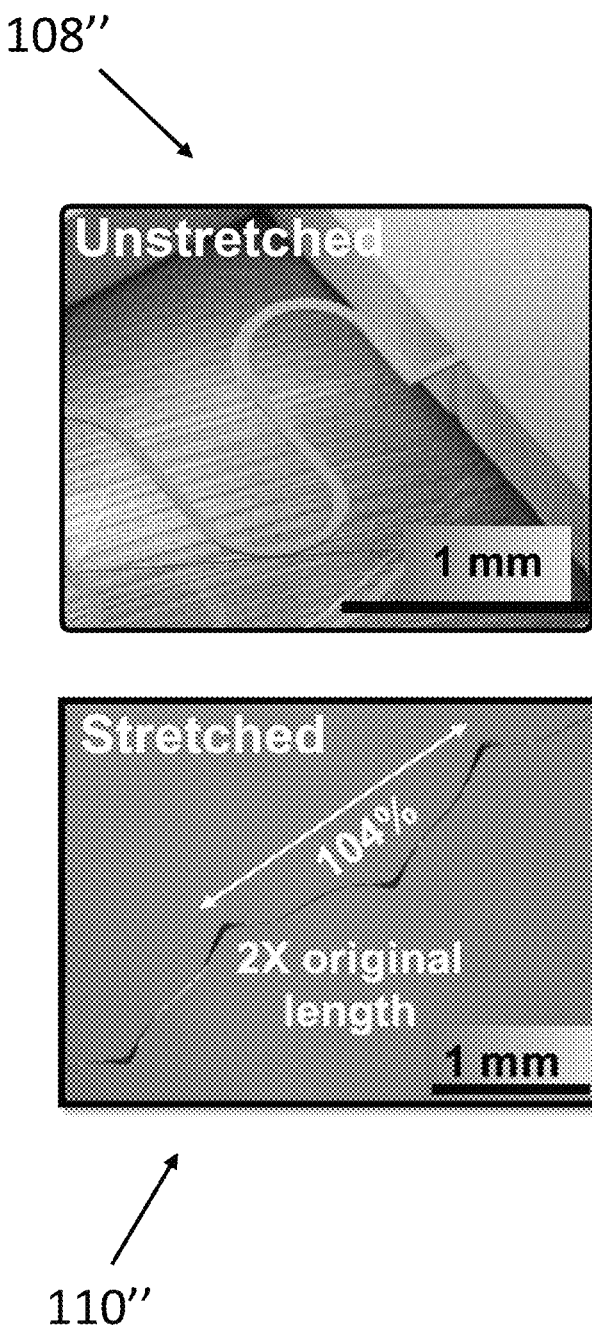
FIG. 16 depicts optical micrographs of a serpentine interconnect structure stretching.

FIG. 16 shows scanning electron microscopy images of one embodiment of a serpentine interconnect structure 108" in unstretched and stretched conditions. It is an in-plane 7 µm Si serpentine coated in 2 µm shape memory alloy (NiTi), like in FIG. 1B. As described in detail above, these serpentines have excellent mechanical performance, with the interconnect experimentally demonstrating uniaxial strain of 104% (double its original length as shown 108"), to the length as shown at 110".

There are many uses for electronics formed into an auxetic geometry that can synclastically bend over a curved surface. Such uses include: easily rolled or folded, lightweight solar blankets, canopies, and tarps that allow independent, off-the-grid, power generation in the field for tactical unit energy independence, wearable solar cell integration into the soldier's uniform or backpack, conformal solar cells would allow their addition onto the exterior of vehicles such as airplanes, helicopters, cars, tanks, ships, drones, weather balloons etc. to extend mission life, integration of electronics into building materials. Other uses include stretchable/flexible displays, cameras, IR sensors, photodiodes, transistors, thermoelectric devices, computers, phones, communication systems, and the like.

While the foregoing is directed to embodiments of the present invention, other and further embodiments of the invention may be devised without departing from the basic scope thereof, and the scope thereof is determined by the claims that follow.

The invention claimed is:

1. A deformable array of semiconductor devices comprising:
   a plurality of triangular islands, where each triangular island comprises at least one semiconductor device and the plurality of triangular islands are arranged in an auxetic geometry so that the array exhibits a negative Poisson's ratio when loaded under tensile strain; and
   a plurality of serpentine interconnects coupling the plurality of triangular islands to one another, each having a first end which connects to one triangular island and a second end which connects to an adjacent triangular island and a plurality of bends therebetween,
   wherein the triangular islands and the serpentine interconnects lie in the same plane in an unstretched condition, and
   wherein, in the unstretched condition, each serpentine interconnect couples, at its first end, to the one triangular island near one corner of the one triangular island, extends in a direction toward another corner of the one triangular island, bends in the same plane to extend in the opposite direction to back towards the one corner of the one triangular island, at least twice, and couples, at its second end, to the adjacent triangular island.

2. The deformable array of semiconductor devices of claim 1 wherein the serpentine interconnects also comprise PN junctions.

3. The deformable array of semiconductor devices of claim 2 wherein the serpentine interconnects comprise lateral (side-by-side) PN junctions.

4. The deformable array of semiconductor devices of claim 2 wherein the serpentine interconnects comprise vertical PN junctions.

5. The deformable array of semiconductor devices of claim 1 wherein each triangular island has a PN junction on a sidewall thereof.

6. The deformable array of semiconductor devices of claim 5 wherein the PN junctions on the sidewalls of the triangular islands form solar cells.

7. The deformable array of semiconductor devices of claim 6 wherein the PN junctions on the sidewalls of the triangular islands provide additional active solar cell area.

8. The deformable array of semiconductor devices of claim 1 wherein the auxetic geometry maintains functionality under a uniaxial strain of at least 20%.

9. The deformable array of semiconductor devices of claim 1 wherein the auxetic geometry maintains functionality under a biaxial strain of at least 20%.

10. The deformable array of semiconductor devices of claim 1 wherein the serpentine interconnects have curved or rectangular corners at the bends.

11. The deformable array of semiconductor devices of claim 1, wherein six adjacent triangular islands and the serpentine interconnects coupling the six adjacent triangular islands together are arranged around a common point to form a hexagon-shape in an unstretched condition.

12. The deformable array of semiconductor devices of claim 1, wherein the triangular islands and the serpentine interconnects substantially lie in the same plane in the unstretched and a stretched condition.

13. The deformable array of semiconductor devices of claim 1, wherein the triangular islands and the serpentine interconnects have the same thickness.

14. The deformable array of semiconductor devices of claim 1, wherein, in the unstretched position, each serpentine interconnect is positioned between the sidewalls of the one triangular island and the adjacent triangular island.

15. The deformable array of semiconductor devices of claim 1, wherein the serpentine interconnects are configured to be flexible and permit bending in-plane and out-of-plane.

16. A deformable array of semiconductor devices comprising:
a plurality of islands arranged in an auxetic geometry so that the array exhibits a negative Poisson's ratio when loaded under tensile strain; and
a plurality of serpentine interconnects coupling the plurality of islands to one another, each having a first end which connects to one island and a second end which connects to an adjacent island and a plurality of bends therebetween,
wherein the islands and interconnects lie in the same plane in an unstretched condition,
wherein, in the unstretched condition, each interconnect couples, at its first end, to the one island near one corner of the one island, extends in a direction toward another corner of the one island, bends in the same plane to extend in the opposite direction to back towards the one corner of the one island, at least twice, and couples, at its second end, to the adjacent island, and
wherein a semiconductor device is formed within or on at least one of the islands and/or at least one of the serpentine interconnects.

17. The deformable array of semiconductor devices of claim 16, wherein an active PN junction is incorporated into the top and/or sidewalls of the islands forming the semiconductor devices.

18. A method of fabricating a deformable array of semiconductor devices according to claim 16, the method comprising:
providing a substrate comprising a $SiO_2$ layer over a Si layer;
etching the $SiO_2$ layer to form a $SiO_2$ hard mask that defines an auxetic geometry comprising the islands and the serpentine interconnects between the islands;
etching through the Si layer to define the islands and serpentine interconnects in accordance with the hard mask on the Si so that the array exhibits a negative Poisson's ratio when loaded under tensile strain; and
depositing at least one material onto the etched substrate to form at least one semiconductor device on the islands.

19. The method of fabricating a deformable array of semiconductor devices of claim 18 wherein the at least one material comprises at least one of metal, and one active semiconductor component.

20. The method of fabricating a deformable array of semiconductor devices of claim 18 wherein the depositing is performed by vapor phase deposition techniques, spin coating, or spray coating.

21. The method of fabricating a deformable array of semiconductor devices of claim 18 wherein the deposited materials form PN junctions in the islands.

22. The method of fabricating a deformable array of semiconductor devices of claim 21 wherein the PN junctions form solar cells.

23. The method of fabricating a deformable array of semiconductor devices of claim 22 wherein the depositing further comprises depositing materials on the serpentine interconnects to form additional PN junctions on the serpentine interconnects.

24. The method of fabricating a deformable array of semiconductor devices of claim 22 wherein PN junctions are formed on a sidewall of each island and/or each serpentine interconnect.

25. The method of fabricating a deformable array of semiconductor devices of claim 24 wherein the sidewall PN junctions create active solar areas in addition to the solar cells formed in the islands.

* * * * *